United States Patent [19]

Sudweeks

[11] Patent Number: 5,606,568
[45] Date of Patent: Feb. 25, 1997

[54] METHOD AND APPARATUS FOR PERFORMING SERIAL AND PARALLEL SCAN TESTING ON AN INTEGRATED CIRCUIT

[75] Inventor: Bruce D. Sudweeks, San Jose, Calif.

[73] Assignee: Megatest Corporation, San Jose, Calif.

[21] Appl. No.: 565,337

[22] Filed: Nov. 30, 1995

[51] Int. Cl.⁶ .................................................. G06F 11/00
[52] U.S. Cl. ............................................. 371/27; 371/22.3
[58] Field of Search ............................. 371/22.3, 22.5, 371/27; 395/183.06

[56] References Cited

U.S. PATENT DOCUMENTS

5,483,544   1/1976   Shur ........................................... 371/27

Primary Examiner—Vincent P. Canney
Attorney, Agent, or Firm—Steven F. Caserza; Flehr, Hohbach, Test, Albritton & Herbert

[57] ABSTRACT

An integrated circuit test apparatus according to an exemplary embodiment includes a first memory section configured to store processor procedures and a second memory section configured to simultaneously store parallel integrated circuit test vectors and serial integrated circuit test vectors. A processor is coupled to the first memory section and to the second memory section. The processor is configured to execute the processor procedures to simultaneously manipulate the parallel integrated circuit test vectors and the serial integrated circuit test vectors located in the second memory to test an integrated circuit. Advantages of the invention include the ability to simultaneously store serial and parallel test vectors and to test a device under test (DUT) with simultaneous serial and parallel test vectors. The combination of serial and parallel test vectors increases performance and efficiency of the test apparatus.

14 Claims, 7 Drawing Sheets

METHOD AND APPARATUS FOR PERFORMING SERIAL AND PARALLEL SCAN TESTING ON AN INTEGRATED CIRCUIT

FIELD

The present invention relates to integrated circuit testing. Specifically, the invention relates to a method and apparatus for performing serial and parallel scan testing on an integrated circuit.

BACKGROUND

The present invention pertains to a testing method and structure for performing level sensitive scan design (LSSD) testing of electronic circuits using parallel test vector memory.

Figure 1:
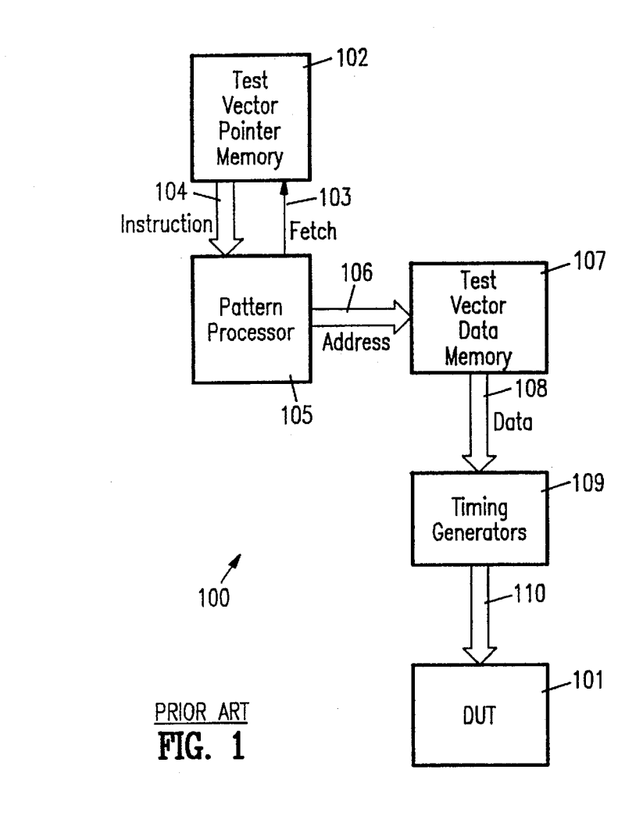
FIG. 1 depicts an integrated circuit test apparatus according to the prior art.

FIG. 1 shows a prior art system 100 for testing an electronic device under test (DUT) 101. Test system 100 includes test vector pointer memory 102 which stores a plurality of predefined test instruction defining the electronic tests to be performed on DUT 101. Pattern processor 105 receives, in response to a fetch signal applied to test vector pointer memory 102 via fetch line 103, an instruction via instruction bus 104 from test vector pointer memory 102. In response to the instruction, pattern processor 105 provides one or a sequence of addresses via address bus 106 to test vector data memory 107 in order to access one or more test vectors previously stored in test vector data memory 107. These one or more test vectors are sequentially sent via data bus 108 to timing generators 109 which serve to convert the test vector data into appropriately timed signals having appropriate voltage and current levels which are in turn applied via bus 110 to appropriate leads of DUT 101. Such a prior art test system as shown in FIG. 1 is well known in the art and is described, for example, in R. Powell, "IBM's VLSI Logic Test System," IEEE Test Conference Proceedings, pp. 388–392 (1981).

Figure 2:
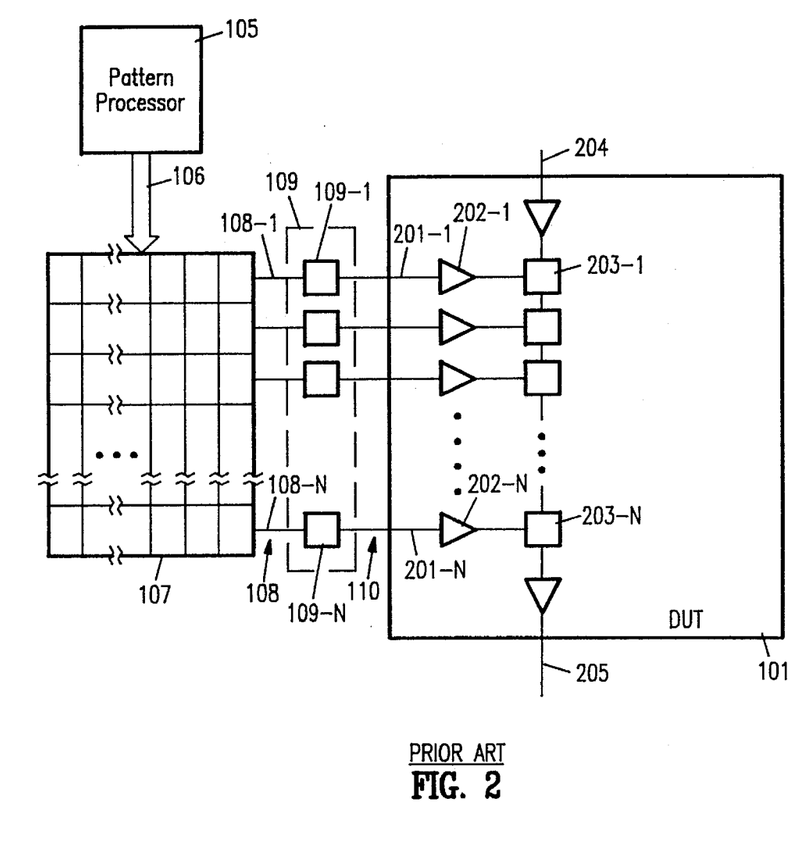
FIG. 2 depicts a pattern processor and parallel test vector memory arrangement of an integrated circuit test apparatus according to the prior art.

As shown in FIG. 2, during normal operation, parallel test vectors are addressed from test vector data memory 107 by pattern processor 105, and in turn applied via leads 108-1 through 108-N of bus 108 to individual timing generators and associated electronics 109-1 through 109-N, which in turn apply desired signal levels to input leads 201-1 through 201-N of DUT 101.

Several types of instructions can be stored in test vector pointer memory 102 for controlling pattern processor 105. One such instruction is the test-vector-strip (TVS) instruction, which has the following format:

TVS<count><address> where TVS is the instruction type, <count> is the number of sequential vectors within test vector data memory 107 to be sequentially addressed by pattern processor 105, and <address> is the address within test vector data memory 107 containing the first one of the sequential vectors. For example, a TVS instruction TVS 15 1102 causes pattern processor 105 to sequentially address 15 vectors stored within test vector data memory 107, beginning at address 1102 and thus ending at address 1116.

With the advent of large scale integrated circuits, problems of device testing have been compounded. For example, as the number of components and input leads in an integrated circuit increases, the greater the number of combinations and permutations of input data sequences and output data sequences. It becomes increasingly difficult to test all such combinations and permutations, as well as consuming greater time in programming the test sequence, storing the number of test vectors, and taking increased time to test each integrated circuit. These problems add to the cost of integrated circuit testing.

In order to reduce some of these problems with testing LSI devices, integrated circuits have been designed using the level sensitive scan design (LSSD) technique, as described by E. Eichelberger and T. Williams, "A Logic Design Structure for LSI Testability," Journal of Design Automation and Fault Tolerant Computing, Vol. 2 No. 2 pp. 165–178 (May 1978). Using this LSSD technique, DUT 101 of FIG. 2 is designed to include a plurality of gates or latches 203-1 through 203-N, each associated with an input lead 201-1 through 201-N of DUT 101. Input signals on input leads 201-1 through 201-1 through 201-N are applied to latches 203-1 through 203-N via input buffers 202-1 202-N. The output leads of latches 203-1 through 203-N are connected to internal circuitry (not shown) of DUT 101, thereby allowing the parallel input signals applied to parallel input leads 201-1 through 201-N of DUT 101 to cause DUT 101 to operate in a normal fashion. However, in addition, DUT 101 includes serial LSSD input lead 204 and serial LSSD output lead 205 having latches 203-1 through 203-N connected serially therebetween. While FIG. 2 shows only a single chain of latches 203-1 through 203-N and single pair of LSSD input and output leads such as leads 204, 205, it is to be understood that DUT 101 can have any desired number of LSSD channels including latches for temporarily storing logic level at any desired locations within DUT 101. Each such LSSD channel includes a plurality of latches such as latches 203-1 through 203-N, and LSSD input and output leads 204, 205, as well as an associated input buffer and output buffer. By utilizing such LSSD channels, normal, parallel data input operation of DUT 101 can be suspended while the contents of such latches are preset by rippling in serial input signals from LSSD input lead 204 and sequentially reading on LSSD output lead 205 the contents of each LSSD register 203-1 through 203-N. This allows the test system the ability to preset data values at desired locations internal to DUT 101 without the need for causing such data values to be preset in response to parallel input test vectors applied to input leads 201-1 201-N.

Figure 3:
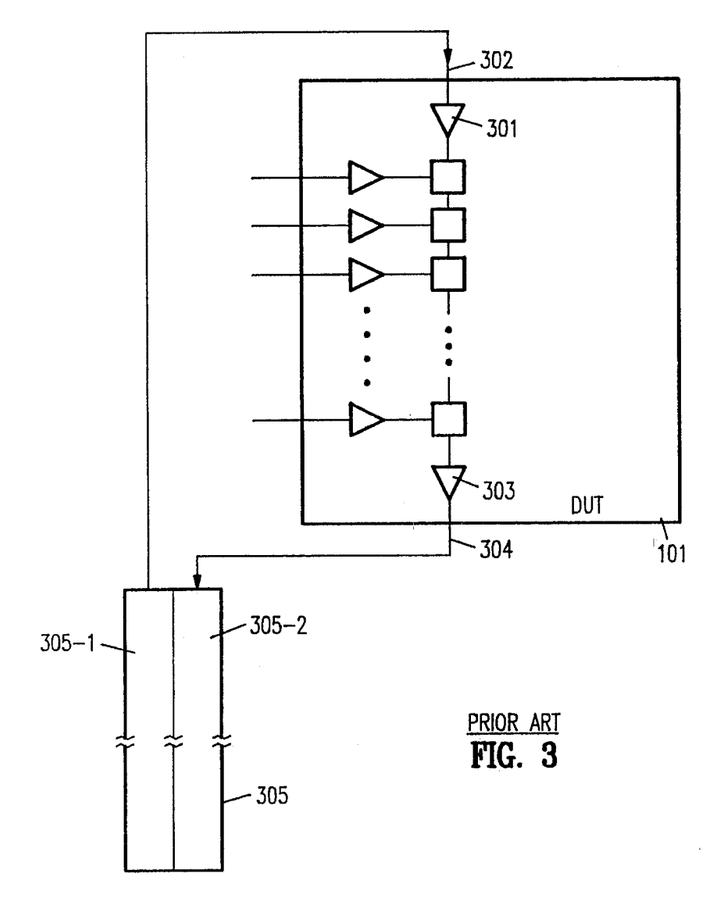
FIG. 3 depicts a serial test vector memory arrangement of an integrated circuit test apparatus according to the prior art.

Normal parallel input signal operation of DUT 101 is performed as previously described utilizing test vector data memory 107 which applies parallel test vectors to parallel input leads 201-1 through 201-N. However, as shown in FIG. 3, when it is desired to test DUT 101 using LSSD input and output leads 302, 304, separate serial LSSD input memory 305-1 and LSSD output memory 305-2 is used. During LSSD testing, the contents of LSSD input memory 305-1, which is configured to be one bit wide per LSSD channel and typically on the order of 100 Mbits deep, are sequentially applied to LSSD input lead 302. Simultaneously, the contents of the latches in the LSSD channel are sequentially output on LSSD output lead 304 and compared to expected LSSD output memory 305-2 which is one bit wide per LSSD channel and typically the same depth as is LSSD input memory 305-1.

Unfortunately, this prior art technique for performing LSSD testing requires the use of additional memories 305-1, 305-2, thereby adding to cost and complexity of the test system.

Figure 4:
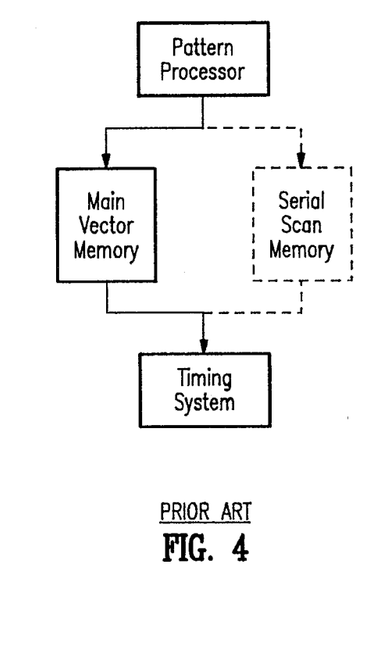
FIG. 4 depicts a support apparatus for a serial integrated circuit test apparatus according to the prior art.

FIG. 4 is a block diagram showing the fact that serial scan memory in the prior art is typically an option, causing an added cost in the test system. With such serial scan memory added as an option, it is expensive and the user must make a trade-off between its width and depth for a given cost justification.

SUMMARY

The present invention relates to integrated circuit testing. Specifically, the invention relates to a method and apparatus for performing serial and parallel scan testing on an integrated circuit.

An integrated circuit test apparatus according to an exemplary embodiment includes a first memory section configured to store processor procedures and a second memory section configured to simultaneously store parallel integrated circuit test vectors and serial integrated circuit test vectors. A processor is coupled to the first memory section and to the second memory section. The processor is configured to execute the processor procedures to simultaneously manipulate the parallel integrated circuit test vectors and the serial integrated circuit test vectors located in the second memory to test an integrated circuit.

Advantages of the invention include the ability to simultaneously store serial and parallel test vectors and to test a device under test (DUT) with simultaneous serial and parallel test vectors. The combination of serial and parallel test vectors increases performance and efficiency of the test apparatus.

BRIEF DESCRIPTION OF THE FIGURES

Additional advantages of the invention will become apparent upon reading the following detailed description and upon reference to the drawings, in which.

DETAILED DESCRIPTION

The present invention relates to integrated circuit testing. Specifically, the invention relates to a method and apparatus for performing serial and parallel scan testing on an integrated circuit.

Figure 5:
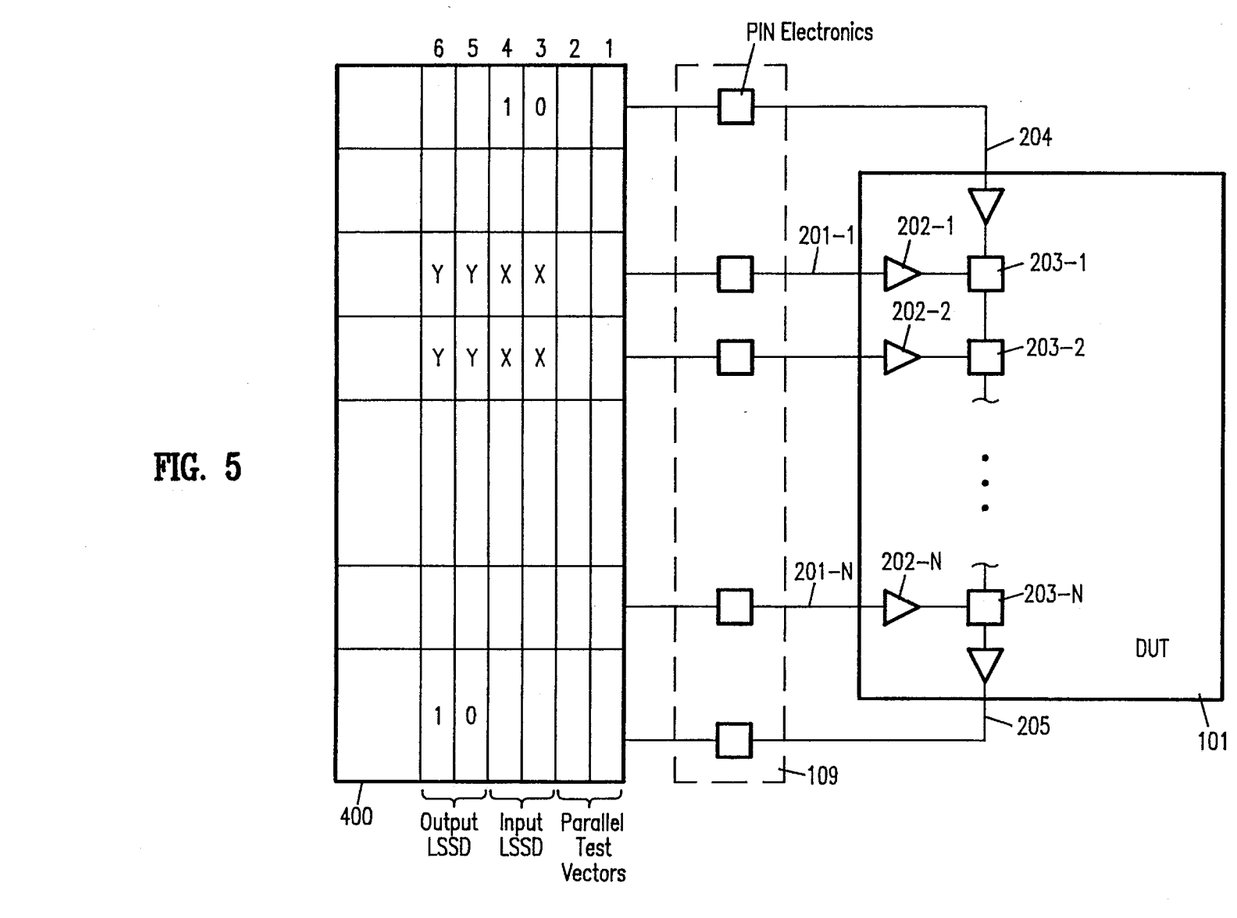
FIG. 5 depicts an embodiment of a parallel and serial integrated circuit test apparatus according to the invention.

In accordance with the teachings of this invention, a single memory is used for both parallel input test vector testing and serial LSSD test vector testing of an LSSD device. As shown in FIG. 5, test vector memory 400 includes a plurality of vectors arranged in columns, each column containing a plurality of bits forming a single test vector. A plurality of these bits are applied through pin electronics 109 to parallel input leads 201-1 through 201-N, which are the normal input leads of DUT 101. Furthermore, an additional one bit of each test vector is applied to each LSSD channel input lead, such as input lead 204. Similarly, a pair of test vector bits are applied via pin electronics 109 to each LSSD output channel, such as output lead 205.

During normal parallel testing of DUT 101, pin electronics 109 is selectively disabled such that LSSD input and output leads 204, 205 are isolated from the test procedure. At this time, the desired one of the remaining bits are applied through pin electronics 109 to parallel input leads 201-1 through 201-N allowing normal, parallel testing of DUT 101. Conversely, during LSSD testing of DUT 101, LSSD test vectors are selected from vector memory 400 having desired data which is applied to pin electronics 109 and to LSSD input and output leads 204, 205.

Figure 6:
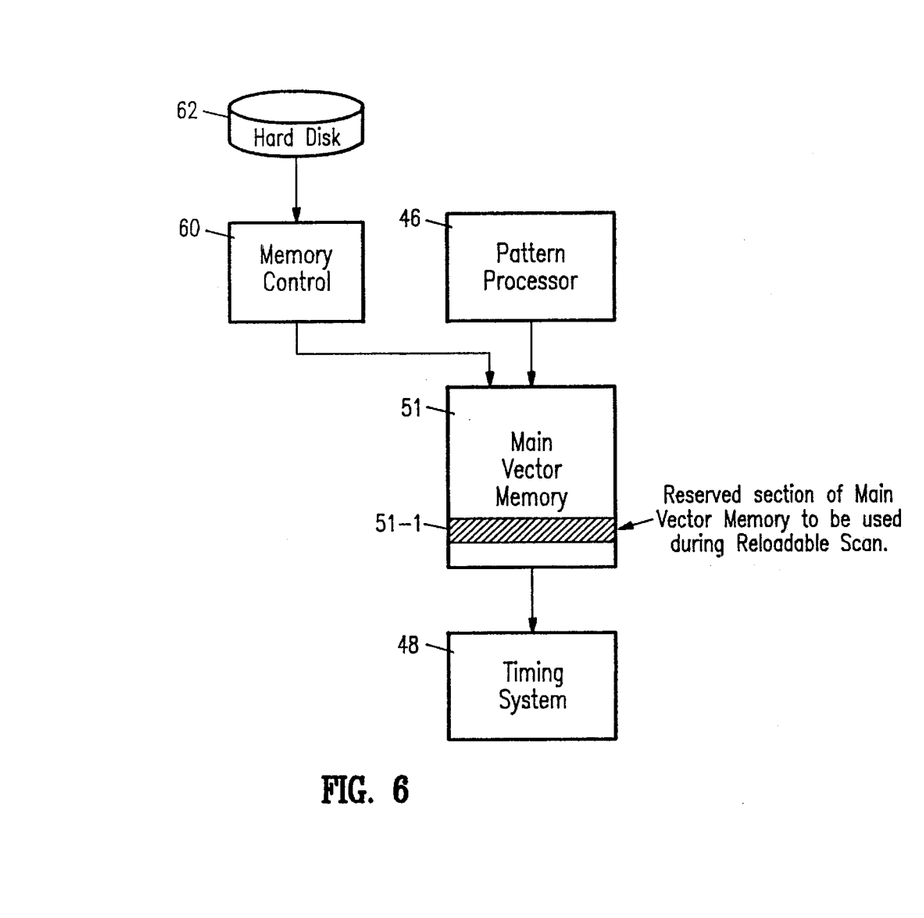
FIG. 6 depicts an embodiment of a memory control apparatus for a parallel and serial integrated circuit test apparatus according to the invention.

FIG. 6 shows a simplified diagram of a test system including a pattern processor 46 and timing system 48, and main vector memory (MVM) 51. Main vector memory 51 is coupled to memory control 60 that is also coupled to a hard disk 62 for bulk storage of various test vectors. The connection between main vector memory 51 and memory control 60 is a high speed data connection so that main vector memory can be quickly loaded and reloaded. Within main vector memory 51 is a reserved section 51-1 used for storing reloadable scan vectors. Section 51-1 is advantageous because often only a section of main vector memory 51 needs to be reloaded and by reserving section 51-1 for a reloadable scan, the test vector download time is decreased, which correspondingly reduces the test time.

Figure 7A:
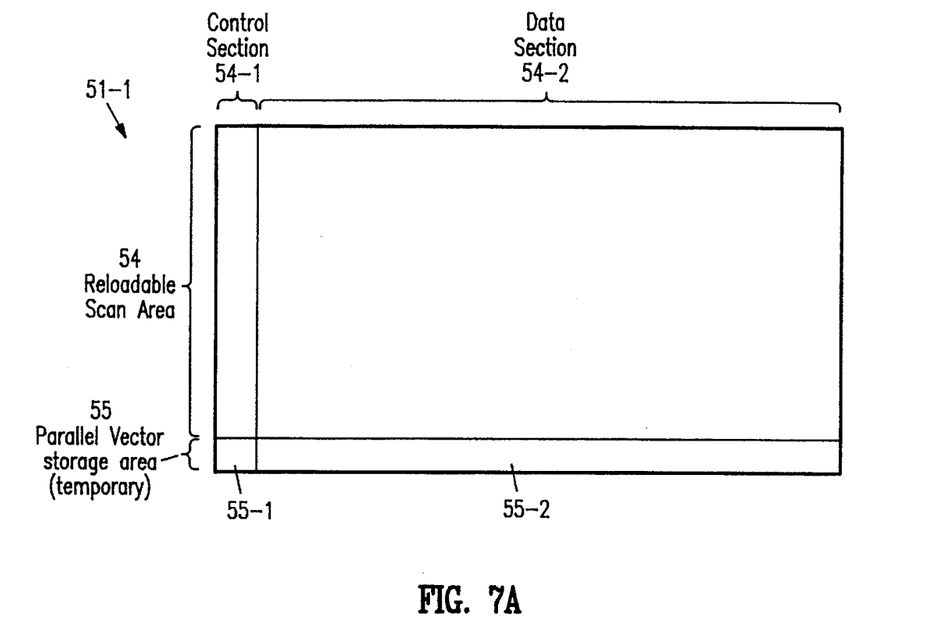
FIGS. 7A–B depicts the main vector memory of the embodiment of FIG. 6.

The operation of the test apparatus is explained with reference to FIGS. 7A–B which are diagrams depicting the memory layout of the reserved section 51-1 of main vector memory 51. As shown in FIG. 7A, reserved section 51-1 includes a number of sub-areas such as a reloadable scan area 54, which includes control portion 54-1 that determines how data portion 54-2 is executed, and a parallel vector area 55 which serves as the area that will contain the finished product—the information that will be applied to DUT 101 at the appropriate time.

Figure 7B:
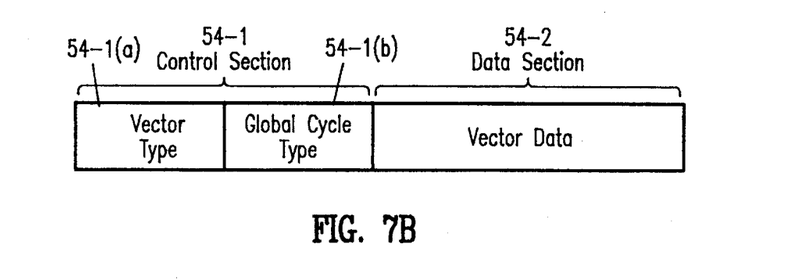

As shown in FIG. 7B, control portion 54-1 is subdivided into vector type 54-1(a) and global cycle type 54-1(b) fields. Control portion 54-1 determines how data portion 54-2 is used. Vector type field 54-1(a) is an opcode that determines the type of vector that will be applied to DUT 101. While there are a large number of possible vector types, this specification describes a test vector type. Other types of vectors are known in the art and may be substituted for the described test vector. Of the test vector described, two sub-types of vectors are further described: a parallel vector, and a serial vector. A difference between the two sub-types of vectors is how the data is manipulated. A parallel test vector uses the entire data portion, and a serial test vector uses only the data that is required to stimulate the DUT's serial input and to check the DUT's serial output pins. Global cycle type field 54-1(b) is used to control the speed of testing and is used to select a global test cycle. The global test cycle is used to determine how the data portion is applied to the DUT pins.

Data portion 54-2 includes one or more data bits dedicated to each pin of DUT 101. The data bits used in conjunction with global cycle type control field 54-1(b) determine how DUT 101 is tested. For example, data portion 54-2 in conjunction with the global cycle type can direct the test apparatus to drive a logic high state, drive a logic low state, produce a high impedance state, strobe a DUT pin for a logic high state, strobe a DUT pin for a logic low state, or strobe a DUT pin for a high impedance state.

In accordance with the teachings of this invention, a number of methods and structure are provided to accomplish the fast reload of data in reserved section 51-1. The following aspects to the embodiments can be employed individually or in combination to provide a fast reloadable vector according to the invention.

In one aspect of the invention, a hardware-based fast fill mechanism is provided to fill a large area of the control portion 54-1 of reserved section 51-1 with a generic serial scan control pattern. The generic serial scan control pattern comprises a relatively large amount of information that serves to generally describe the required tests, and the generic serial scan control pattern can be quickly downloaded. The generic serial scan control pattern is intended to be later customized for the specific tests, and the purpose of the generic serial scan control pattern fast fill is to minimize the subsequent communication time required for the exception download. For example, if the known serial test vector pattern comprises mostly alternating 0 and 1 with some exceptions, a generic pattern of alternating 0 and 1 is downloaded (fast filled) to control portion 54-1. At a later time, a second download is performed to customize the exceptions to the generic pattern. The second download is much smaller than the generic serial scan control pattern and takes very little time to download. This technique reduces the overall download time considerably.

In another aspect of the invention, a fast tester access (FTA) main vector memory load mechanism is provided to allow fast loading of only the required data for each serial scan chain in main vector memory 51. This technique loads only the required updates into main vector memory 51 and promotes a fast download to further reduce test time.

In another aspect of the invention, a main vector memory to main vector memory overlay mechanism is provided in order to distribute ("sprinkle") a relatively small number of exceptions to the generic serial scan control pattern which has been stored in the control portion of main vector memory 51. Again, this technique loads only the required updates into main vector memory 51 and promotes a fast download to further reduce test time.

Figure 8:
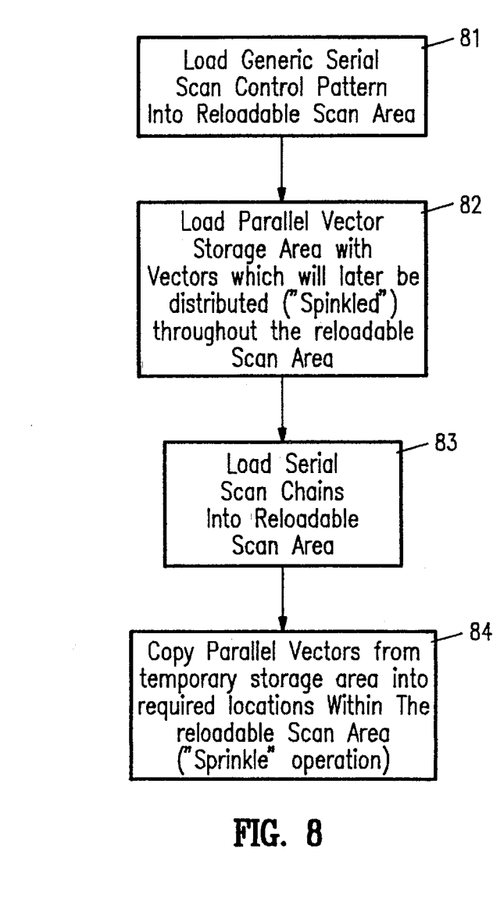
FIG. 8 depicts a flowchart for simultaneously testing parallel and serial test vectors in an integrated circuit test apparatus.
Figure 9:
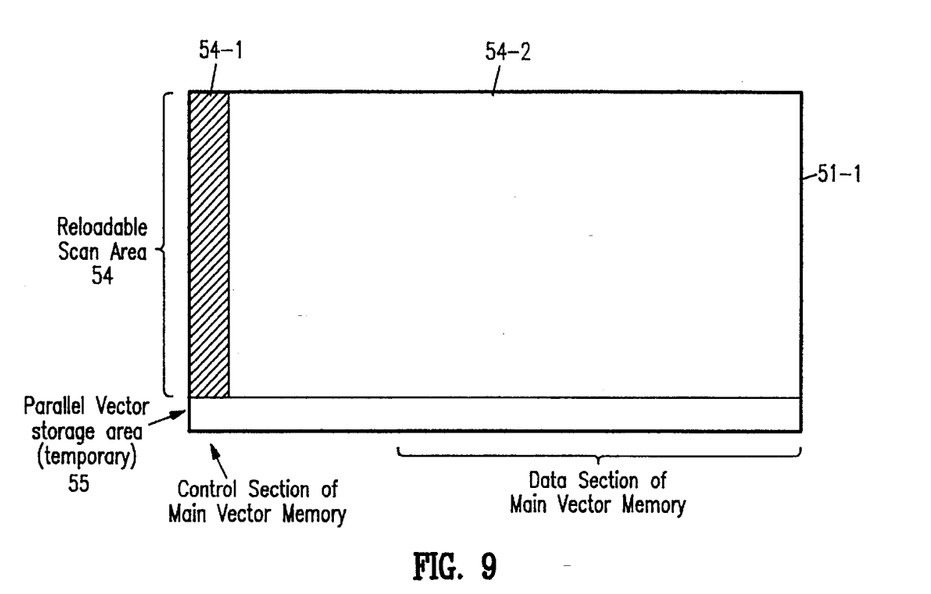
FIG. 9 depicts the main vector memory of the embodiment of FIG. 6 after step 81 of FIG. 8.

FIG. 8 is a flowchart depicting the operation of a test apparatus according to an embodiment of the invention. Step 81 loads a generic serial scan control pattern into reloadable scan area 54. FIG. 9 is a diagram depicting the status of reserved section 51-1 after step 81 is performed. Thus, FIG. 9 shows reserved section 51-1 including reloadable scan area 54 which is filled with the generic serial scan control pattern in control portion 54-1.

Figure 10:
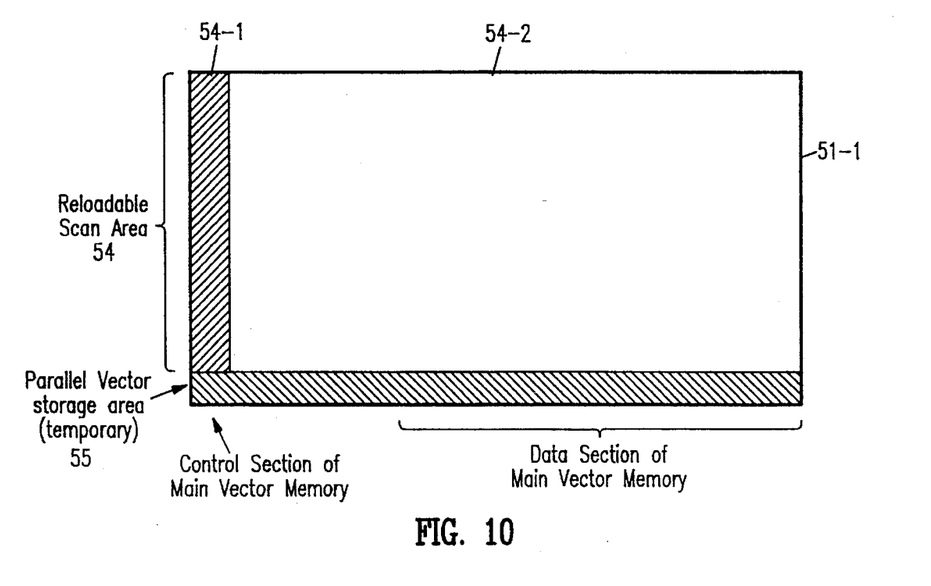
FIG. 10 depicts the main vector memory of the embodiment of FIG. 6 after step 82 of FIG. 8.

FIG. 10 depicts reserved section 51-1 following step 82 in which parallel vector storage area 55 is loaded with vectors that will later be distributed ("sprinkled") throughout the reloadable scan area 54, and after step 83 wherein the serial scan chains are loaded into data portion 54-2.

Figure 11:
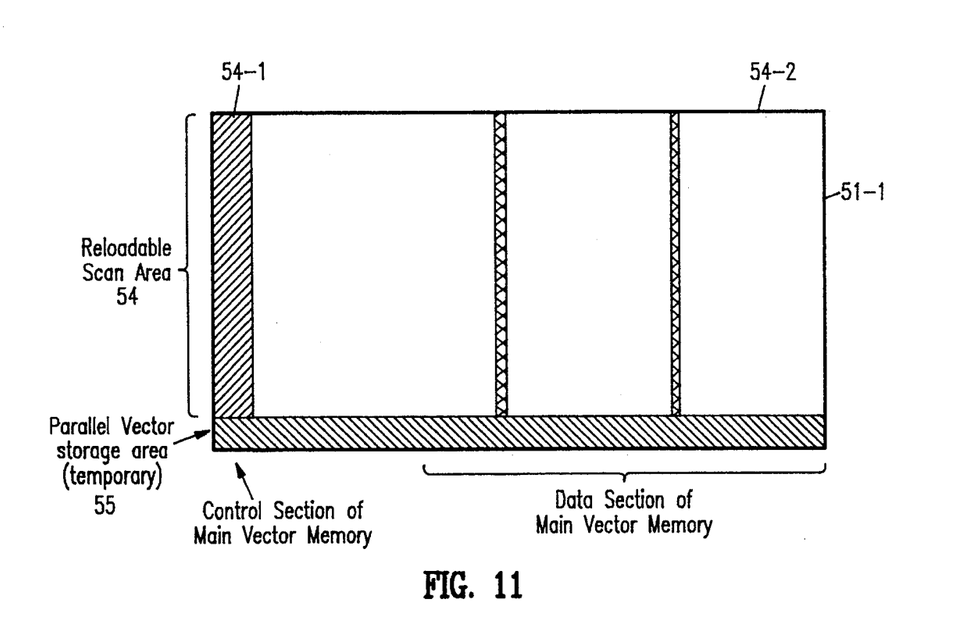
FIG. 11 depicts the main vector memory of the embodiment of FIG. 6 after step 83 of FIG. 8.

FIG. 11 shows the status of reserved section 51-1 after step 83 where the serial scan chains are loaded into data portion 54-2 of reloadable scan area 54.

Figure 12:
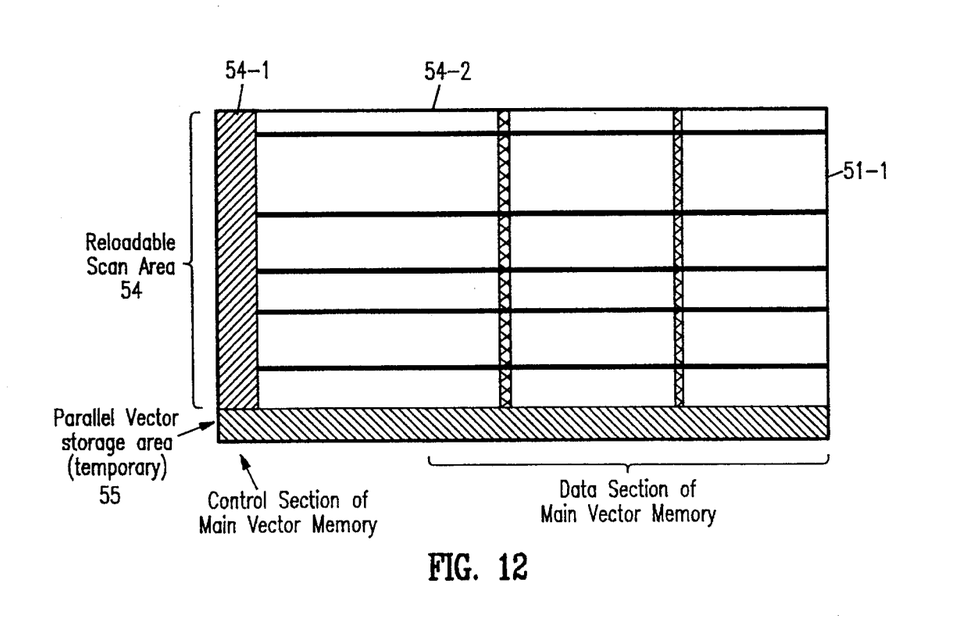
FIG. 12 depicts the main vector memory of the embodiment of FIG. 6 after step 84 of FIG. 8.

FIG. 12 depicts the status of reserved section 51-1 after step 84, which is the step of distributing ("sprinkling") parallel vectors throughout reloadable scan area 54 using the MVM to MVM overlay mechanism. This mechanism copies the parallel vectors from parallel vector storage area 55 to locations where they are needed in reloadable scan area 54.

Thus, in accordance with the teachings of this invention, a novel method and structure is taught for sharing memory in a test system for use in storing both normal test vectors and scan test vectors. A novel method and structure is also taught for very rapidly loading new scan vectors into memory. In one embodiment of this invention, the entire process for updating the reloadable scan area 51-1 is accomplished at a rate of 50 milliseconds per million scan vectors for the first serial scan chain comprising a serial scan input and output pin pair on the device under test, and approximately 18 milliseconds per million scan vectors for subsequent serial scan chains.

CONCLUSION

Advantages of the invention include the ability to simultaneously store serial and parallel test vectors and to test a device under test with simultaneous serial and parallel test vectors. The combination of serial and parallel test vectors increases performance and efficiency of the test apparatus.

The invention now being fully described, including the best mode, it will be apparent to one of ordinary skill in the art that many changes and modifications can be made thereto within the spirit or scope of the appended claims.

I claim:

1. An integrated circuit test apparatus, comprising:
   a first memory section configured to store processor procedures;
   a second memory section configured to simultaneously store parallel integrated circuit test vectors and serial integrated circuit test vectors;
   a processor coupled to said first memory section and to said second memory section, said processor configured to execute said processor procedures to simultaneously manipulate said parallel integrated circuit test vectors and said serial integrated circuit test vectors located in said second memory section to test an integrated circuit.

2. The integrated circuit test apparatus of claim 1, wherein:
   said processor is further configured to load a generic serial scan pattern into said second memory section.

3. The integrated circuit test apparatus of claim 1, wherein:
   said processor is further configured to load only the required data for each serial scan chain into said second memory section.

4. The integrated circuit test apparatus of claim 1, wherein:
   said processor is further configured to distribute a relatively small number of exceptions to a generic serial scan pattern in said second memory section.

5. The integrated circuit test apparatus of claim 2, wherein:
   said processor is further configured to load only the required data for each serial scan chain into said second memory section.

6. The integrated circuit test apparatus of claim 2, wherein:

said processor is further configured to distribute a relatively small number of exceptions to said genetic serial scan pattern in said second memory section.

7. The integrated circuit test apparatus of claim 5, wherein:

said processor is further configured to distribute a relatively small number of exceptions to said generic serial scan pattern in said second memory section.

8. A method of testing an integrated circuit using an integrated circuit test apparatus including a first memory section configured to store processor procedures, a second memory section configured to simultaneously store parallel integrated circuit test vectors and serial integrated circuit test vectors, and a processor coupled to the first memory section and to the second memory section, said method comprising the steps of:

retrieving a procedure from the first memory section for execution by the processor;

executing the retrieved procedure to arrange a parallel test vector and a serial test vector in the second memory section;

simultaneously performing the parallel test vector and serial test vector to test the integrated circuit.

9. The method of claim 8, wherein:

said executing step is performed by loading a generic serial scan pattern into said second memory section.

10. The method of claim 8, wherein:

said executing step is performed by loading only the required data for each serial scan chain into said second memory section.

11. The method of claim 8, wherein:

said executing step is performed by distributing a relatively small number of exceptions to a generic serial scan pattern in said second memory section.

12. The method of claim 9, wherein:

said executing step is performed by loading only the required data for each serial scan chain into said second memory section.

13. The method of claim 9, wherein:

said executing step is performed by distributing a relatively small number of exceptions to the generic serial scan pattern in said second memory section.

14. The method of claim 12, wherein:

said executing step is performed by distributing a relatively small number of exceptions to the generic serial scan pattern in said second memory section.

* * * * *